United States Patent [19]
Zettler

[11] Patent Number: 5,930,171
[45] Date of Patent: Jul. 27, 1999

[54] CONSTANT-CURRENT SOURCE WITH AN EEPROM CELL

[75] Inventor: Thomas Zettler, München, Germany

[73] Assignee: Siemens Aktiengesellschaft, Muenchen, Germany

[21] Appl. No.: 08/977,509

[22] Filed: Nov. 24, 1997

Related U.S. Application Data

[63] Continuation of application No. PCT/DE96/00762, May 2, 1996.

[30] Foreign Application Priority Data

May 22, 1995 [DE] Germany .......................... 195 18 728

[51] Int. Cl.$^6$ .................................................. G11C 11/34
[52] U.S. Cl. ................................ 365/185.18; 365/185.26
[58] Field of Search ........................... 365/185.18, 185.26

[56] References Cited

U.S. PATENT DOCUMENTS

| | | | |
|---|---|---|---|
| 4,104,575 | 8/1978 | Bauer | 323/4 |
| 4,222,062 | 9/1980 | Trotter et al. | 365/185.18 X |
| 4,375,087 | 2/1983 | Wanlass | 365/218 |
| 5,477,499 | 12/1995 | Van Buskirk et al. | 365/185.22 X |
| 5,559,733 | 9/1996 | McMillan et al. | 365/145 |
| 5,754,474 | 5/1998 | Lee | 365/185.2 X |

FOREIGN PATENT DOCUMENTS

| | | |
|---|---|---|
| 0 621 603 A1 | 10/1994 | European Pat. Off. . |
| 2 259 376 | 3/1993 | United Kingdom . |

*Primary Examiner*—Do Hyun Yoo
*Attorney, Agent, or Firm*—Herbert L. Lerner; Laurence A. Greenberg

[57] ABSTRACT

A constant-current source includes a MOSFET having a drain electrode connected to a first terminal of the current source and a source electrode and a control gate electrode connected to a second terminal of the current source. A floating gate having a charge of the opposite charge-carrier type to the channel type of the FET is disposed between the control gate and the channel of the FET.

4 Claims, 1 Drawing Sheet

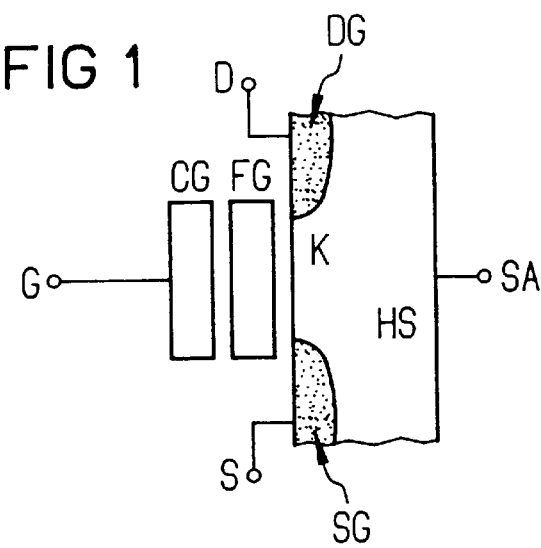
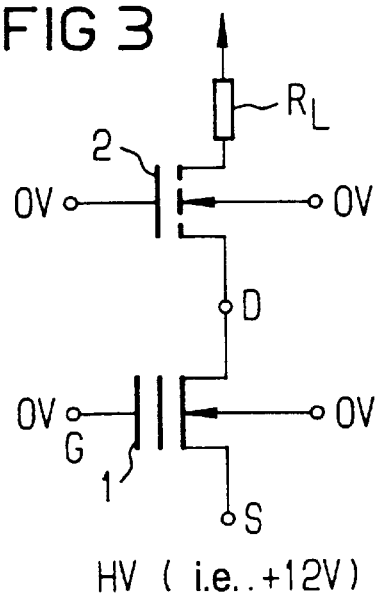
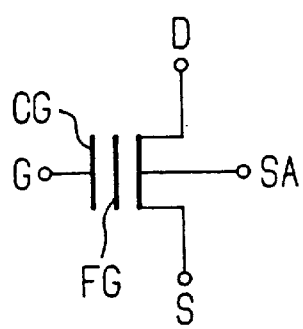
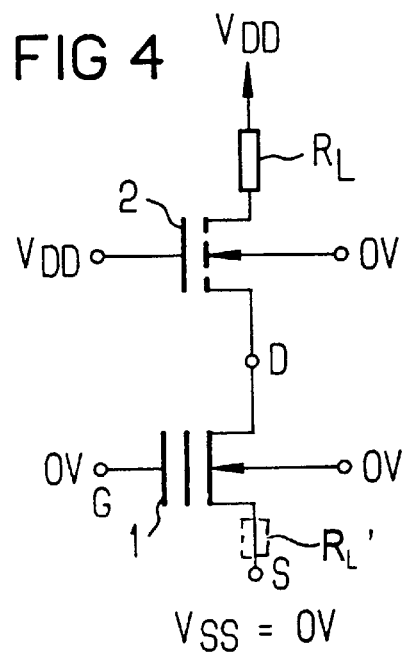

CONSTANT-CURRENT SOURCE WITH AN EEPROM CELL

CROSS-REFERENCE TO RELATED APPLICATION

This application is a continuation of International Application Ser. No. PCT/DE96/00762, filed May 2, 1996.

BACKGROUND OF THE INVENTION

FIELD OF THE INVENTION

The invention relates to a constant-current source with a MOSFET having a drain electrode connected to a first terminal of the current source and a source electrode and a control gate electrode connected to a second terminal of the current source.

Such a constant-current source is, for example, disclosed in a book entitled "Halbleiterschaltungstechnik" [Semiconductor Circuit Technology] by Tietze and Schenk, 6th Edition, 1983, pages 94 and 95. In that case, use is made of a field-effect transistor of the depletion type, i.e. a normally-on field-effect transistor, as a result of which that current source can advantageously be used as a two-terminal network, since it is not necessary to apply an auxiliary voltage to the control gate. The production of such an auxiliary voltage would require additional circuitry.

However, a disadvantage of such a normally-on field-effect transistor is that it requires additional process steps in the case of conventional production processes for CMOS or BICMOS circuits.

U.S. Pat. No. 4,375,087 discloses an EEPROM storage cell which is formed with an n-channel MOS transistor equipped with a fully insulated gate that is disposed between the channel and the control gate and is in the floating state. Electrons are applied to the gate in order to program the cell, and are removed again upon erasure.

SUMMARY OF THE INVENTION

It is accordingly an object of the invention to provide a constant-current source with an EEPROM cell, which overcomes the hereinafore-mentioned disadvantages of the heretofore-known devices of this general type, in particular in the case of an MOS technology with EEPROM cells.

With the foregoing and other objects in view there is provided, in accordance with the invention, a constant-current source, comprising first and second current source terminals; and a MOSFET having a channel with a given channel type, a control gate, a drain electrode connected to the first current source terminal, a source electrode and a control gate electrode connected to the second current source terminal, and a floating gate disposed between the control gate and the channel, the floating gate having a charge with a charge-carrier type opposite to the given channel type.

As a result of the charge existing on the floating gate, minority carriers of the semiconductor substrate in which the field-effect transistor is produced are attracted into the channel region, so that a normally-on field-effect transistor, i.e. a quasi-depletion type FET, is produced without additional process steps having been required.

The charge of the opposite charge-carrier type to the channel type is obtained by a so-called "over-erase" process, i.e. a process of erasing over the neutral state. In the case of EEPROMs of the n-channel type, for example, in order to carry out programming a high positive voltage of about 18 volts is applied to the control gate and a voltage of about 5 V is applied to the drain, with the source being grounded or earthed. Of those electrons flowing in the channel region, so-called "hot" electrons reach the floating gate located between the control gate and a channel, as a result of which the threshold voltage of the EEPROM cell is shifted to positive values. In order to erase this cell, the ground or earth potential is applied to the gate and the positive high voltage is applied to the source, with the drain electrode being left in the floating state. As a result of this circuit layout, the electrons tunnel from the floating gate into the source. If the erase voltage is applied for too long, more electrons tunnel into the source than previously arrived there during the programming using hot electrons, so that the floating gate becomes positively charged, as a result of which a normally-on field-effect transistor is produced. The latter is used according to the invention as a constant-current source.

In accordance with another feature of the invention, the MOSFET is connected to a high-voltage source and is isolated from a load to be supplied, for applying the charge to the floating gate.

In accordance with a concomitant feature of the invention, there is provided a resistor connected between the source electrode of the MOSFET and the second current source terminal.

Other features which are considered as characteristic for the invention are set forth in the appended claims.

Although the invention is illustrated and described herein as embodied in a constant-current source with an EEPROM cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a fragmentary, diagrammatic, cross-sectional view of an EEPROM cell produced in a semiconductor substrate;

FIG. 2 is a schematic circuit diagram equivalent to FIG. 1;

FIG. 3 is a diagram showing a circuit layout of an EEPROM cell for erasing it or bringing it into an "over-erased" state; and FIG. 4 is a circuit diagram of a constant-current source according to the invention.

DESCRIPTION OF THE PREFERRED EMBODIMENTS

Referring now to the figures of the drawings in detail and first, particularly, to FIG. 1 thereof, there is seen a diagrammatic, cross-sectional representation of an EEPROM cell produced in a semiconductor substrate HS. A drain region DG and a source region SG are both formed in the semiconductor substrate HS and both regions have a doping type opposite to the semiconductor substrate HS. A conducting channel K can be formed in the semiconductor substrate HS, between the drain region DG and the source region SG. A floating gate FG is insulated from the channel region K by an insulator layer which, for example, may be an oxide layer. The floating gate FG is disposed over the channel region K of the semiconductor substrate HS. A control gate CG, which is likewise insulated by an insulator layer, is disposed over the floating gate FG. The control gate CG has a gate electrode G, the source region SG has a source electrode S and the drain region DG has a drain electrode D. The semiconductor substrate HS has a substrate electrode SA. FIG. 2 represents an equivalent circuit diagram for such an EEPROM cell.

In order to program such an EEPROM cell, potentials which permit a current flow in the channel region K are applied to the drain and source electrodes D, S. A potential which has an opposite polarity to the minority carriers in the semiconductor substrate HS is applied to the gate electrode G. As a result, these minority carriers are attracted into the channel region and lead to an enhanced current flow. If the potential at the gate electrode G is selected to be very high, so-called "hot" electrodes can reach the floating gate FG through the gate oxide. As a result, this floating gate becomes charged, so that minority carriers are repelled from the channel region K. Due to this mechanism, the threshold voltage of the EEPROM cell is shifted to higher values. In the case of an n-channel EEPROM cell, the floating gate would thus become negatively charged, as a result of which the threshold voltage of the cell would be shifted to more positive values. A voltage intermediate between the threshold voltages of an unprogrammed cell and a programmed cell would be applied to the gate in order to read-out this cell. Depending on the strength of the current flow which then takes place, a logic "0" or a logic "1" could then be read out from the cell. In order to erase such a cell, the charge carriers must again be removed from the floating gate.

A basic circuit layout of an EEPROM cell for the erase process is represented in FIG. 3. An n-channel MOSFET 2 which is connected in series with an EEPROM cell 1 is turned off, so that the drain electrode D of the EEPROM cell 1 is in the floating state. Ground or earth potential is applied to the gate electrode G of the EEPROM cell 1, while a high voltage HV which, for example, may be equal to +12 V, is applied to the source electrode S. As a result of this high voltage HV, the charge carriers on the floating gate FG are made to tunnel through the gate oxide to the source region SG. However, if the high voltage HV is applied to the source electrode S for too long, more electrons tunnel from the floating gate FG to the source region SG than arrived there during the programming process. As a result, the floating gate FG becomes positively charged. Such a positive charging is referred to as "over-erasure" and, in the case of a conventional use of EEPROM cells as memory cells, should be avoided under all circumstances, since a reading error otherwise occurs.

However, in the case of the present invention, such an "over-erasure" process leads to charging of the floating gate, according to the invention, with a charge which has a charge-carrier type opposite to the channel type of the MOSFET that forms the EEPROM cell. This thus means that, in the case of the n-channel MOSFET which forms the EEPROM cell 1 according to FIG. 3, the floating gate FG is positively charged, so that negative charge carriers, i.e. electrons, constantly collect in the channel region K, with the result that an EEPROM cell which is treated in this way externally acts as a normally-on field-effect transistor.

FIG. 4 represents a constant-current source according to the invention with an "over-erased" EEPROM cell 1. This "over-erased" EEPROM cell is connected in series with a load resistor $R_L$ between first and second supply potentials VDD and VSS. In this case the first supply potential VDD may be equal, for example, to approximately 5 V, while the second supply potential VSS is equal to 0 V. The gate electrode of the "over-erased" EEPROM cell 1 is likewise connected to 0 V, i.e. to the second supply potential VSS. The drain electrode D of the "over-erased" EEPROM cell 1 is connected through a switch 2 to the load resistor $R_L$. The switch 2 is formed by using a normally-off n-channel MOSFET, the gate electrode of which has the first supply potential VDD applied thereto. However, any other desired switch. The purpose of this switch 2 is to disconnect the load resistor $R_L$ from the high voltage HV applied to the floating gate of the EEPROM cell 1, when the floating gate of the EEPROM cell 1 is being charged by an "over-erasure" process. As is shown in FIG. 3, this is carried out by applying the second potential VSS of 0 V to the gate of the switch 2 formed by a normally-off channel MOSFET, as a result of which this MOSFET is turned off. According to an advantageous development of this constant-current source, a further resistor $R_{L'}$, with the aid of which the internal resistance of the constant-current source can be increased, may be connected between the source electrode of the EEPROM cell 1 and the second potential VSS, as is shown in phantom.

Instead of using an n-channel MOSFET as the EEPROM cell, it is naturally also possible to use a p-channel MOSFET, although it is necessary to suitably alter the voltages required for erasing this EEPROM cell and for operating the "over-erased" EEPROM cell as a constant-current source.

I claim:

1. A constant-current source circuit, comprising:

first and second current source terminals; and a constant current source including an over-erased MOSFET having a channel with a given channel type, a control gate, a drain electrode connected to said first current source terminal, a source electrode and a control gate electrode connected to said second current source terminal, and a floating gate disposed between said control gate and said channel, said floating gate having a charge with a charge-carrier type opposite to said given channel type.

2. The constant-current source according to claim 1, wherein said MOSFET is connected to a high-voltage source and is isolated from a load to be supplied, for applying the charge to said floating gate.

3. The constant-current source according to claim 1, including a resistor connected between the source electrode of said MOSFET and said second current source terminal.

4. A constant-current source circuit, comprising:

first and second current source terminals;

a constant current source including an over-erased MOSFET having a channel with a given channel type, a control gate, a drain electrode connected to said first current source terminal, a source electrode and a control gate electrode connected to said second current source terminal, and a floating gate disposed between said control gate and said channel, said floating gate having a charge with a charge-carrier type opposite to said given channel type;

a switch having two switch terminals; one of said switch terminals connected to said first current source terminal; and a load resistor connected to another one of said switch terminals.

* * * * *